(12) United States Patent
Gardner

(10) Patent No.: US 7,087,976 B2
(45) Date of Patent: Aug. 8, 2006

(54) INDUCTORS FOR INTEGRATED CIRCUITS

(75) Inventor: Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/774,956

(22) Filed: Feb. 9, 2004

(65) Prior Publication Data

US 2004/0157370 A1 Aug. 12, 2004

Related U.S. Application Data

(62) Division of application No. 10/238,539, filed on Sep. 10, 2002, now Pat. No. 6,727,154, which is a division of application No. 09/444,608, filed on Nov. 23, 1999, now Pat. No. 6,452,247.

(51) Int. Cl.
*H01L 29/00* (2006.01)

(52) U.S. Cl. ........................... 257/531; 438/381

(58) Field of Classification Search ............... 438/622, 438/381; 257/700, 528, 531; 336/200
See application file for complete search history.

(56) References Cited

U.S. PATENT DOCUMENTS

| | | | |
|---|---|---|---|
| 3,607,462 A | 9/1971 | Liang | |
| 3,881,244 A | 5/1975 | Kendall | 29/602 |
| 3,905,883 A | 9/1975 | Hanazono et al. | |
| 4,543,553 A | 9/1985 | Mandai et al. | |
| 4,791,719 A | 12/1988 | Kobayashi et al. | |
| 4,797,648 A | 1/1989 | Kaneko et al. | |
| 4,816,784 A | 3/1989 | Rabjohn | |
| 5,047,296 A | 9/1991 | Miltenberger et al. | |
| 5,095,357 A | 3/1992 | Andoh et al. | 357/51 |
| 5,121,852 A | 6/1992 | Wilkes | |
| 5,221,459 A | 6/1993 | Okano et al. | |
| 5,331,203 A * | 7/1994 | Wojnarowski et al. | 257/698 |
| 5,420,558 A | 5/1995 | Ito et al. | |
| 5,446,311 A | 8/1995 | Ewen et al. | 257/508 |
| 5,469,399 A | 11/1995 | Sato et al. | |
| 5,530,415 A | 6/1996 | Takaya | |

(Continued)

FOREIGN PATENT DOCUMENTS

DE 4117878 A1 12/1991

(Continued)

OTHER PUBLICATIONS

Shirakawa, K., et al., "Thin film cloth-structured inductor for magnetic integrated circuit", *IEEE Transactions on Magnetics*, vol. 26, No. 5, XP00150520, (Sep. 1990),2262-2264.

(Continued)

*Primary Examiner*—Tuan H. Nguyen
(74) *Attorney, Agent, or Firm*—Schwegman, Lundberg, Woessner & Kluth, P.A.

(57) ABSTRACT

An inductor for an integrated circuit or integrated circuit package comprises a three-dimensional structure. In one embodiment the inductor is arranged on an integrated circuit substrate in at least two rows, each row comprising upper segments and lower segments, with the upper segments being longer than the lower segments. The upper segments in a first row are offset 180 degrees from those in an adjoining row to provide greater coupling of magnetic flux. The materials and geometry are optimized to provide a low resistance inductor for use in high performance integrated circuits. In another embodiment the inductor is arranged on an integrated circuit package substrate. Also described are methods of fabricating the inductor on an integrated circuit or as part of an integrated circuit package.

20 Claims, 4 Drawing Sheets

U.S. PATENT DOCUMENTS

| | | | |
|---|---|---|---|
| 5,583,474 | A | 12/1996 | Mizoguchi et al. |
| 5,609,946 | A | 3/1997 | Korman et al. |
| 5,635,892 | A | 6/1997 | Ashby et al. ............... 336/200 |
| 5,694,030 | A | 12/1997 | Sato et al. |
| 5,705,287 | A | 1/1998 | Doerner et al. |
| 5,753,391 | A | 5/1998 | Stone et al. ................ 430/22 |
| 5,793,272 | A | 8/1998 | Burghartz et al. |
| 5,801,100 | A | 9/1998 | Lee et al. .................. 438/678 |
| 5,834,825 | A | 11/1998 | Imai |
| 5,877,533 | A | 3/1999 | Arai et al. .................. 257/350 |
| 5,892,425 | A | 4/1999 | Kuhn et al. |
| 5,952,704 | A | 9/1999 | Yu et al. ..................... 257/528 |
| 5,961,746 | A | 10/1999 | Nepela |
| 5,976,715 | A | 11/1999 | Chen et al. |
| 6,031,445 | A | 2/2000 | Marty et al. |
| 6,033,782 | A | 3/2000 | Hubbard et al. |
| 6,037,649 | A | 3/2000 | Liou .......................... 257/531 |
| 6,040,226 | A | 3/2000 | Wojnarowski et al. ...... 438/381 |
| 6,067,002 | A | 5/2000 | Fujino et al. |
| 6,103,136 | A | 8/2000 | Han |
| 6,114,937 | A | 9/2000 | Burghartz et al. .......... 336/200 |
| 6,121,852 | A | 9/2000 | Mizoguchi et al. |
| 6,166,422 | A | 12/2000 | Qian et al. |
| 6,169,320 | B1* | 1/2001 | Stacey ........................ 257/531 |
| 6,191,495 | B1 | 2/2001 | Kossives et al. |
| 6,201,287 | B1 | 3/2001 | Forbes ....................... 257/528 |
| 6,207,303 | B1 | 3/2001 | Tomita |
| 6,239,482 | B1* | 5/2001 | Fillion et al. ............... 257/678 |
| 6,240,621 | B1 | 6/2001 | Nellissen et al. .......... 29/602.1 |
| 6,281,560 | B1 | 8/2001 | Allen et al. ................. 257/414 |
| 6,291,305 | B1 | 9/2001 | Huang et al. ............... 438/381 |
| 6,344,125 | B1 | 2/2002 | Locke et al. ................ 205/118 |
| 6,404,317 | B1 | 6/2002 | Mioguchi et al. |
| 6,441,715 | B1 | 8/2002 | Johnson |
| 6,445,271 | B1* | 9/2002 | Johnson ..................... 336/200 |
| 6,452,243 | B1 | 9/2002 | Hatano et al. |
| 6,452,247 | B1* | 9/2002 | Gardner ...................... 257/528 |
| 2001/0041401 | A1* | 11/2001 | Ahn et al. .................. 438/238 |

FOREIGN PATENT DOCUMENTS

| | | |
|---|---|---|
| EP | 0295028 A1 | 12/1988 |
| EP | 0725407 | 8/1996 |
| EP | 0844783 A2 | 12/1998 |
| JP | 61020311 | 1/1986 |
| JP | 06124843 | 5/1994 |
| JP | 07272932 | 10/1995 |
| WO | WO-0139220 A1 | 5/2001 |

OTHER PUBLICATIONS

Yamaguchi, M., et al., "Characteristics of magnetic thin-film inductors at large magnetic field", *Proceedings of the Int'l Magnetics Conf.*, XP000581941, (Apr. 18, 1995),BS-1.

"Magnetic Devices Research",(various articles) http://mems.mirc.gatech.edu/research/magnetic.html. 10 pgs.

Baba, M., et al., "GHz-drive Magnetic Thin-Film Inductor Using CoNbZr film", *Journal of the Magnetics Society of Japan*, 24(4-2), (2000), 879-882.

Brandon, E., et al., "Microinductors for spacecraft power electronics", *Magnetic Materials, Processes and Device VI Applications to Storage and Microelectromechanical systems (MEMS)*, vol. 2000-29, The Electrochemical Society, Inc., Pennington, New Jersey, (2001), 559-567.

Brandon, E., et al., "Passive Components for Systems-on-a-Chip Applications", *International Conference on Integrated Micro Nanotechnology for Space Applications*, Center for Integrated Space Microsystems, Jet Propulsion Laboratory, (Apr. 11-15, 1999), 3 pgs.

Brandon, E., "System on a Chip Integrated Passive Components (µIRS)", 2 pgs.

Burghartz, J., "Integrated Multilayer RF Passives in Silicon Technology", *1998 Topical Meeting on Silicon Monolithic Integrated Circuits in RF Systems, Digest of Papers*, (Sep. 17-18, 1998), 141-147.

Burghartz, J. N., "Progress in RF Inductors on Silicon-Understanding substrate Losses", *Techn. Dig. IEDM*, (1998), 523-526.

Fessant, A., et al., "Influence of In-Plane Anisotropy and Eddy Currents on the Frequency Spectra of the Complex Permeability of Amorphous CoZr Thin Films", *IEEE Transactions on Magnetics*, 29(1), (Jan. 1993), 82-87.

Gardner, D., et al., "High Frequency (GHz) and Low Resistance Integrated Inductors Using Magnetic Materials", *Proc. IEEE Int. Interconnect Technol. Conf.*, (Jun. 2001), 101-103.

Gardner, D., et al., "Mechanical Stress as a Function of Temperature for Aluminum Alloy Films", *Journal of Applied Physics*, 67(4), (Feb. 15, 1990),1831-1845.

Kobayashi, Y., et al., "New Type Micro Cloth-inductor and Transformer With Thin Amorphous Wires and Multi-Thin Coils", *IEEE Transactions on Magnetics*, 28(5), (Sep. 1992), 3012-3014.

Korenivski, V., et al., "Magnetic Film Inductors for Radio Frequency Applications", *Journal of Applied Physics*, 82(10), (Nov. 15, 1997), 5247-5254.

Long, J., et al., "The Modeling, Characterization, and Design of Monolithic Inductors for Silicon RF IC's", *IEEE Journal of Solid-State Circuits*, 32(2), (Mar. 1997), 357-369.

Matsuki, H., et al., "A New Cloth Inductor Using Amorphous Fiber", *IEEE Transactions on Magnetics*, 21(5), (Sep. 1985), 1738-1740.

Mohan, S., et al., "Bandwidth Extension in CMOS With Optimized On-Chip Inductors", *IEEE Journal of Solid-State Circuits*, 35(3), (Mar. 2000), 346-355.

Mohan, S., et al., "Modeling and Characterization of On-Chip Transformers", *1998 International Electron Devices Meeting Technical Digest*, Center for Integrated Systems, Stanford University, Stanford, CA,(Dec. 1998), 531-534.

Mohan, S., et al., "Simple Accurate Expressions for Planar Spiral Inductances", *IEEE Journal of Solid-State Circuits*, 34(10), (Oct. 1999), 1419-1424.

Mojarradi, M., et al., "Power Management and Distribution for System on a Chip for Space Applications", *AIAA Conference*, Paper No. 284, (1999), 8 pgs.

Niknejad, A., et al., "Analysis, Design, and Optimization of Spiral Inductors and Transformers Si RF IC's", *IEEE Journal of Solid-State Circuits*, 33(10), (Oct. 1998), 1470-1481.

O'Donnell, T., et al., "Microtransformers and Inductors using Permalloy Thin Films", *Preparation, Properties, and Applications of Thin Ferromagnetic Films*, http://www.iemw.tuwien.ac.at/publication/workshop0600/ODonnell.html, (Jun. 2000), 45-52.

Park, J., et al., "Batch-fabricated Microinductors with electroplated magnetically anisotropic and laminated alloy cores", *IEEE Transactions on Magnetics*, 35(5), (Sep. 1999), 4291-4300.

Sato, T., et al., "New Applications of Nanocrystalline Fe(Co-Fe)-Hf-O Magnetic Films to Micromagnetic Devices", *Journal of Applied Physics*, 83(11), (Jun. 1, 1998), 6658-6660.

Tomita, H., et al., "Oblique-Field Annealing Effect for In-Plane Magnetic Anisotropy of Soft Magnetic Co-Nb-Zr Thin Films", *IEEE Transactions on Magnetics*, 30(3), (May 1994), 1336-1339.

Yabukami, S., et al., "Noise Analysis of a MHz-3 GHz Magnetic Thin Film Permeance Meter", *Journal of Applied Physics*, 85(8), (Apr. 15, 1999), 5148-5150.

Yamaguchi, M., et al., "1 GHz-Drive Magnetic Thin-Film Inductors for RF Integrated Circuits Using Micro-Patterned Granular Film", *Digest of INTERMAG 99. 1999 IEEE International Magnetics Conference*, 1999, (May 18-21, 1999), ED01, 1 pg.

Yamaguchi, M., et al., "Magnetic Films for Planar Inductive Components and Devices", *Handbook of Thin Film Devices*, edited by M.H. Francombe, vol. 4, *Magnetic Thin Film Devices*, (2000), 185-212.

Yamaguchi, M., et al., "Magnetic Thin-Film Inductor for RF Integrated Circuits", *Extended Abstracts of the 1999 International Conference on Solid-State Devices and Materials, Tokyo*, (1999), 580-581.

Yamaguchi, M., et al., "Microfabrication and Characteristics of Magnetic Thin-Film Inductors in the Ultra High Frequency Region", *Journal of Applied Physics*, 85(11), (Jun. 1, 1999), 7919-1922.

Yue, C., et al., "On-Chip Spiral Inductors With Patterned Ground Shields for Si-Based RF ICs", *IEEE Jorunal of Solid-State Circuits*, 33(5), (May 1998), 743-752.

* cited by examiner

INDUCTORS FOR INTEGRATED CIRCUITS

This application is a divisional of U.S. patent application Ser. No. 10/238,539, filed on Sep. 10, 2002, now issued as U.S. Pat. No. 6,727,154, which is a divisional of U.S. patent application Ser. No. 09/444,608, filed on Nov. 23, 1999, now issued as U.S. Pat. No. 6,452,247, both of which are incorporated herein by reference.

TECHNICAL FIELD

The inventive subject matter relates to the structure and fabrication of electrical inductors and, in particular, to an inductor forming an integral part of an integrated circuit, such as a microprocessor, or forming an integral part of an integrated circuit package.

BACKGROUND INFORMATION

In the field of microelectronic circuits there is an incessant competitive pressure among manufacturers to drive the performance of their circuits up while driving down production costs. This is particularly true in the field of microprocessors, where each generation of devices is expected to provide greater performance than its predecessor, to operate at increasingly higher clock speeds and increasingly lower supply voltages, and to be fabricated as cheaply as possible.

Microprocessors currently being designed will require in excess of 100 watts of power to operate, and they will operate at supply voltages of about 1 volt, so the resulting current flowing through them will be nearly 100 amps.

At the same time that the speed and power requirements of commercially competitive microelectronic circuits are constantly increasing, there is an increasingly significant need to provide passive electrical devices such as inductors and transformers directly on such circuits or as part of the integrated circuit package. Due to the high operational current expected in these devices, it is important that they be relatively low in resistance in addition to being small in size and relatively inexpensive to fabricate.

Low resistance inductors and transformers are needed in numerous microelectronic applications, such as high frequency circuits, amplifiers, circuits for reducing electromagnetic interference (EMI), power converters (including direct-current to direct-current, alternating-current to alternating-current, direct-current to alternating current, and alternating-current to direct-current converters) for the distribution of power to circuits, and clocking circuits. In addition, other applications include radio frequency (RF) circuits such as are used in a myriad of wireless devices like cellular telephones, wireless modems, and other types of communications equipment.

Various integrated circuit inductors are known in the semiconductor art. For example, the following patents were found in the course of a search for art relating to the inventive subject matter described herein: U.S. Pat. Nos. 5,095,357, 5,635,892, 5,801,100, 5,877,533, all of which disclose various types of integrated circuit inductor structures. However, none of the known integrated circuit inductors are suitable for use in commercially competitive, high performance, low cost microcircuits, where the requirement is for low resistance, functionally effective, and relatively uncomplicated structures and processes. Some of the inductor structures disclosed in the above-mentioned patents are formed in a planar, spiral pattern, a disadvantage of which is that the magnetic flux goes down into the integrated circuit structure, causing the generation of mirror currents which can harm other circuit components.

For the reasons stated above, there is a substantial need in the semiconductor art for an inductive element for an integrated circuit and for an integrated circuit package, and method of fabrication thereof, which have relatively low resistance and which are relatively inexpensive to manufacture.

In addition, there is a substantial need in the semiconductor art for an integrated circuit and for an integrated circuit package having one or more inductive elements which have relatively low resistance and which are relatively inexpensive to manufacture.

DETAILED DESCRIPTION

In the following detailed description, reference is made to the accompanying drawings which form a part hereof, and in which is shown by way of illustration specific embodiments in which the inventive subject matter may be practiced. It is to be understood that other embodiments may be utilized and structural changes may be made without departing from the scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed.

The inventive subject matter provides a low resistance inductor for use in high performance integrated circuits. In an embodiment, an integrated circuit component or an integrated circuit includes a substrate and at least one multi-level inductive element.

In another further embodiment, an inductive element is formed as part of an electronic package comprising an integrated circuit and a substrate.

In other embodiments, methods of fabricating an inductive element on an integrated circuit or integrated circuit package are described. These methods include forming a first dielectric layer in a manner that varies in the Z-dimension, and forming a first conductive layer over the first dielectric layer. The first conductive layer also varies in the Z-dimension. The first conductive layer has a length and a width, the length being substantially greater than the width in one embodiment, and the length being less than or equal to the width in another embodiment. The first conductive layer is arranged in a substantially straight line along the X-dimension.

Figure 1:
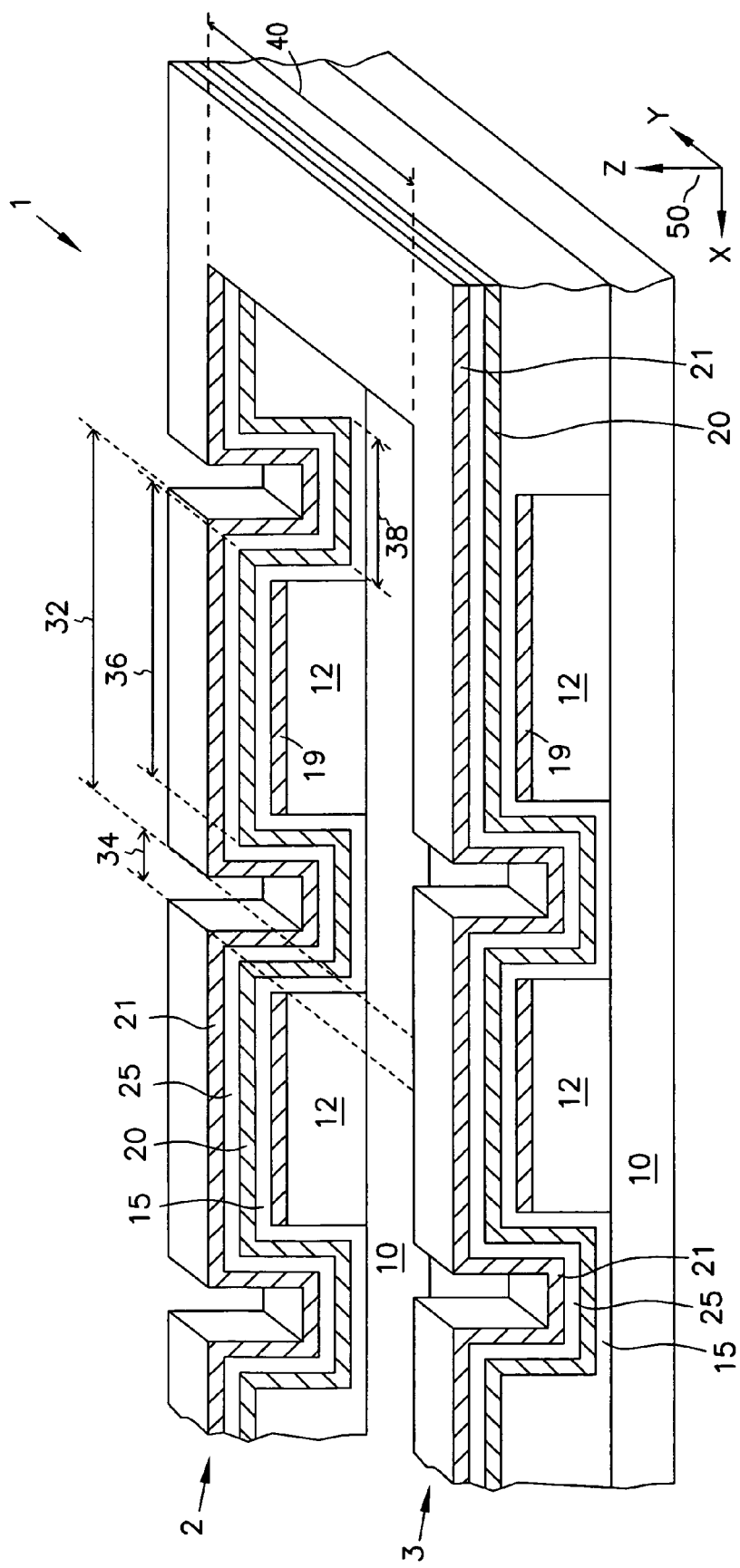
FIG. 1 illustrates a perspective, cross-sectional view of an inductive element in accordance with one embodiment of the invention.

FIG. 1 illustrates a perspective, cross-sectional view of an inductive element 1 in accordance with one embodiment of the invention. In one embodiment, inductive element 1 comprises a first row 2 of a multi-layered structure and a second row 3 of a multi-layered structure. The multi-layered structure can be either an integrated circuit structure or an integrated circuit package structure.

Inductive element 1 may alternatively be fabricated with more or fewer than two rows, depending upon the functional requirements of the particular circuit or circuit package for which the inductive element is used.

By deploying the conductive element in rows, rather than in a spiral, the conductive element can be fabricated relatively wide in order to keep its electrical resistance relatively low. Given the space limitation of an integrated circuit or of a high-density integrated package, it would difficult if not impossible to arrange a conductive element of equivalent width in a spiral pattern so as to provide the equivalent inductance with low electrical resistance.

In one embodiment, as shown in FIG. 1, the inductor is arranged on the substrate in two rows 2 and 3, with each row comprising a plurality of upper segments 32 and a plurality of lower segments 34. In one embodiment, the upper segments 32 are relatively longer than the lower segments 34. In other embodiments the relative lengths of the upper segments 32 and lower segments 34 may be different, depending upon the operational and layout requirements of the particular integrated circuit or integrated circuit package.

In an embodiment, as shown in FIG. 1, a multi-level inductive element 1 is formed on a substrate 10 in a back-and-forth or serpentine pattern comprising at least two rows, such as rows 2 and 3. Each row may comprise a plurality of upper conductive segments 36 and a plurality of lower conductive segments 38. In at least one row (e.g. row 2), the upper conductive segments 36 are longer than the lower conductive segments 38.

As seen with reference to X-Y-Z coordinate set 50 in FIG. 1, the inductor structure, comprising conductive layer 20 and magnetic layers 19 and 21, varies in the Z-dimension along rows 2 and 3.

It will also be seen in FIG. 1 that the length of the inductor structure of a given row is substantially greater than its width, and that the conductive layer in any row is arranged in a substantially straight line along the X-dimension.

In one embodiment, the upper segments 32 in a first row 2 are staggered or offset 180 degrees from those in an adjoining row 3 to provide greater coupling of magnetic flux. The offset of the upper segments 32 of row 2 by 180 degrees relative to those of adjacent row 3 provides relatively greater magnetic flux linkage between these adjacent rows. The offset between upper segments 32 in adjacent rows may be different from 180 degrees, depending upon the operational and layout requirements of the particular integrated circuit or integrated circuit package.

In the embodiment shown in FIG. 1, row 2 is coupled to row 3 using interconnect portion 40. Interconnect portion can comprise a pedestal structure between rows 2 and 3, or other suitable structures can be utilized. To minimize the resistance of inductive element 1, the length of interconnect portion 40 is minimized to the extent possible, and the width of the conductive layer 20 is fabricated relatively wide. The width of the conductive layer 20 in interconnect portion 40 depends upon the operational and layout requirements of the particular integrated circuit or integrated circuit package. Magnetic layers 19 and 21 could be modified or eliminated in the interconnect portion 40.

The structure and composition of a given row, for example row 3, will now be explained. Substrate 10 can be formed from suitable semiconductor materials used for the fabrication of integrated circuits, such as silicon, germanium, gallium arsenide, and similar materials. It can also be formed of a polyimide, a suitable organic material, a printed circuit board, or other dielectric material like glass, quartz, or ceramic, in a manner which will be apparent to one of ordinary skill in the art. In one embodiment silicon is used. The thickness of substrate 10 is not critical.

Insulating layers 12, 15, and 25 can be formed of a suitable insulating material such as silicon dioxide. Other insulating materials could be used, such as silicon nitride, or silicon oxynitride. Any other insulating material known in the art could be used if compatible with the particular semiconductor process being used.

Magnetic layers or magnetic films 19 and 21 can be formed of any suitable magnetic material. Pure elements or alloys comprising iron, nickel, cobalt, manganese, zinc, zirconium, tantalum, rhenium, silicon and/or certain rare earths can be used. Some alloys that can be used are nickel-iron, cobalt-zirconium-tantalum, iron-tantalum-nickel, nickel-iron-rhenium, and ferro-silicon. In one embodiment, cobalt-zirconium-tantalum is used. The integrated circuit inductive element 1 can also be fabricated without magnetic layers 19 and 21, if an inductive device providing substantially less inductance meets the particular circuit or circuit package operational requirements.

Conductive layer 20 can be formed of any suitable conductive material such as a metal like copper, aluminum, tungsten, molybdenum, titanium, gold, silver, or palladium, or an alloy thereof. Conductive layer 20 can also be formed of a metal silicide or doped polysilicon. The thickness of layer 20 is typically in the range of 1 to 15 microns. In one embodiment, conductive layer 20 is formed of copper whose thickness is approximately 1 micron and whose width is approximately 1 millimeter. In one embodiment, the end-to-end resistance of conductive layer 20 is 8–10 milliohms. The total inductance of inductive element 1 can be more than 100 nano-Henries (nH).

The various conductive, magnetic, and insulating layers can be formed by any suitable means known in the art, such as sputtering, electro-plating, chemical vapor deposition (CVD), plasma enhanced chemical vapor deposition (PECVD), physical vapor deposition (PVD), and the like.

Figure 2:
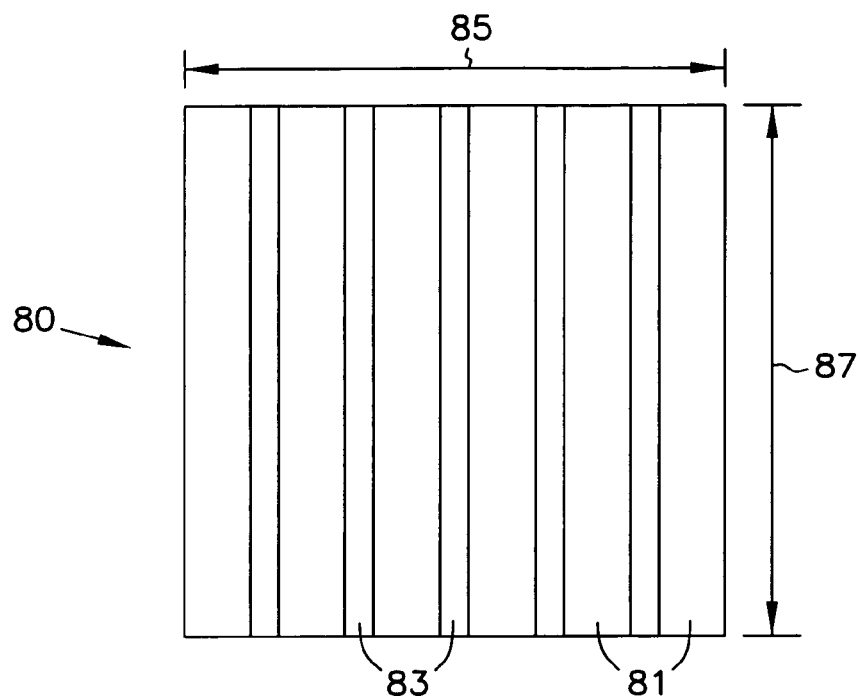
FIG. 2 illustrates a top view of an inductive element in accordance with another embodiment of the invention.

FIG. 2 illustrates a top view of an inductive element 80 in accordance with another embodiment of the invention. Inductive element 80 comprises pedestals 81 alternating with trenches 83, in a structure similar to that shown regarding row 2 or row 3 of inductive element 1 shown in FIG. 1. In the embodiment of inductive element 80 shown in FIG. 2, the width 87 of inductive element 80 is substantially equal to its length 85. This geometry serves to minimize the resistance of inductive element 80. It can be used either in an integrated circuit implementation or in an integrated circuit package implementation of the inductive element. In another embodiment, the width 87 of inductive element 80 is greater than its length 85.

While inductive element 80 is shown in FIG. 2 as comprising a single row, it can comprise two or more rows, with the length 85 of each row being substantially equal to the width 87 of each row, in order to minimize the resistance of inductive element 80. In another embodiment the width 87 of each row is greater than the length 85 of the row.

Figure 3:
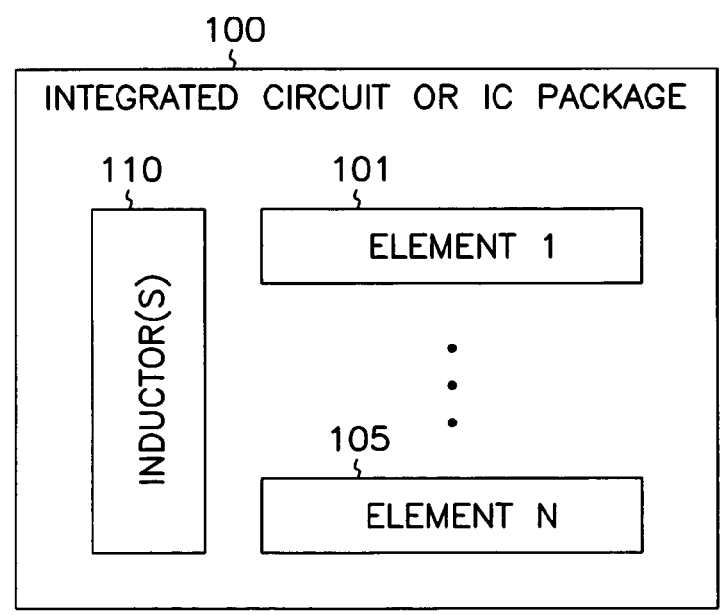
FIG. 3 illustrates a simplified block diagram of an integrated circuit or integrated circuit package comprising an inductive element in accordance with other embodiments of the invention.

FIG. 3 illustrates a simplified block diagram of an integrated circuit or integrated circuit package 100 comprising one or more inductor(s) 110 in accordance with one embodiment of the invention. Inductor(s) 110 can be like any inductive element described previously with reference to FIGS. 1 and 2.

In addition to inductor(s) 110, integrated circuit or integrated circuit package 100 comprises another element or a plurality of other elements, represented schematically by Element 1 (101) through Element N (105), which perform various electronic functions depending upon the type of integrated circuit or integrated circuit package 100.

Elements 1 through N can comprise, for example, one or more of the following: a microprocessor or microcontroller, a memory, an application specific integrated circuit (ASIC), a digital signal processor (DSP), a radio frequency circuit, an amplifier, a power converter, an EMI or other filter, a clocking circuit, and the like.

Elements 1–N can be active and/or passive elements, depending upon the desired function(s) of integrated circuit or integrated circuit package 100. It will be apparent that, in the case where element 100 is an integrated circuit package, Elements 1–N can be mounted or otherwise incorporated into integrated circuit package 100 in any suitable manner. It will also be apparent that while integrated circuit 100 is a planar integrated circuit in one embodiment, it can be any other appropriate type of integrated circuit structure.

Figure 4:
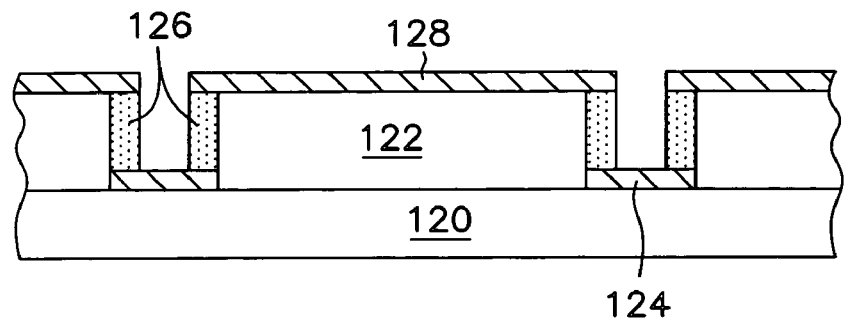
FIG. 4 illustrates a cross-sectional view of an inductive element in accordance with an embodiment of the invention in which multiple conductive layers are interconnected by vias of conductive material.

FIG. 4 illustrates a cross-sectional view of an inductive element in accordance with an embodiment of the invention in which multiple conductive layers 124 and 128 are interconnected by vias 126 of conductive material through insulating layer 122. Similar in overall construction and inductive function to the embodiment illustrated in FIG. 1, the structure of the embodiment shown in FIG. 3 likewise varies in the Z-dimension along the substrate 120.

Via holes 126 can be formed by any suitable process, such as ion milling, reactive ion etching, drilling, routing, punching, or otherwise making holes or slots in insulating layer 122, followed by inserting a conductive material in the holes or slots, in a manner known in the art. For the purposes of simplification, magnetic layers have not been illustrated in FIG. 4 (or in FIGS. 5 and 6, discussed below) as part of the inductive element. However, they can be used in the embodiments illustrated in FIGS. 4–6 to increase the overall inductance of the inductive element.

Figure 5:
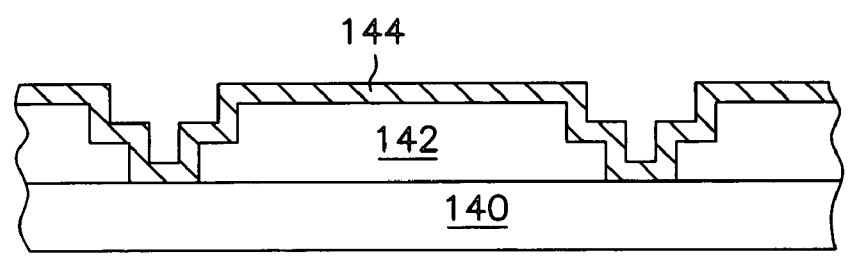
FIG. 5 illustrates a cross-sectional view of an inductive element in accordance with an embodiment of the invention in which a single conductive layer is arranged in a stepped or crenellated manner.

FIG. 5 illustrates a cross-sectional view of an inductive element in accordance with an embodiment of the invention in which a single conductive layer 144 is arranged in a stepped or crenellated manner over insulating layer 142. Similar in overall construction and inductive function to the embodiment illustrated in FIG. 1, the structure of the embodiment shown in FIG. 5 likewise varies in the Z-dimension along the substrate 140, and it can be manufactured by any of a variety of processes known in the art.

Figure 6:
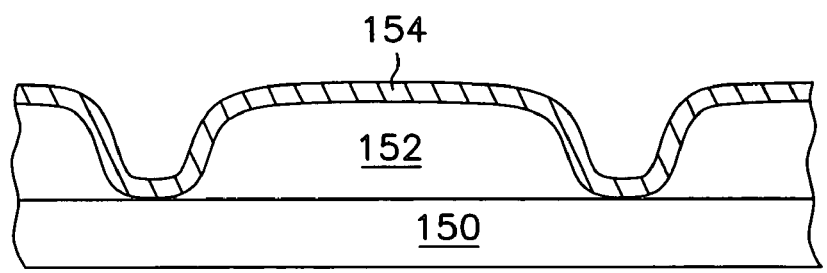
FIG. 6 illustrates a cross-sectional view of an inductive element in accordance with an embodiment of the invention in which a single conductive layer is arranged in an undulating manner.

FIG. 6 illustrates a cross-sectional view of an inductive element in accordance with an embodiment of the invention in which a single conductive layer 154 is arranged in an undulating manner over insulating layer 152. Similar in overall construction and inductive function to the embodiment illustrated in FIG. 1, the structure of the embodiment shown in FIG. 6 likewise varies in the Z-dimension along the substrate 150, and it can be manufactured by any of a variety of processes known in the art.

The embodiment of an inductor using an undulating pattern shown in FIG. 5 can be expected to have less magnetic flux linkage between adjacent rows than an embodiment as illustrated in FIG. 1.

Figure 7:
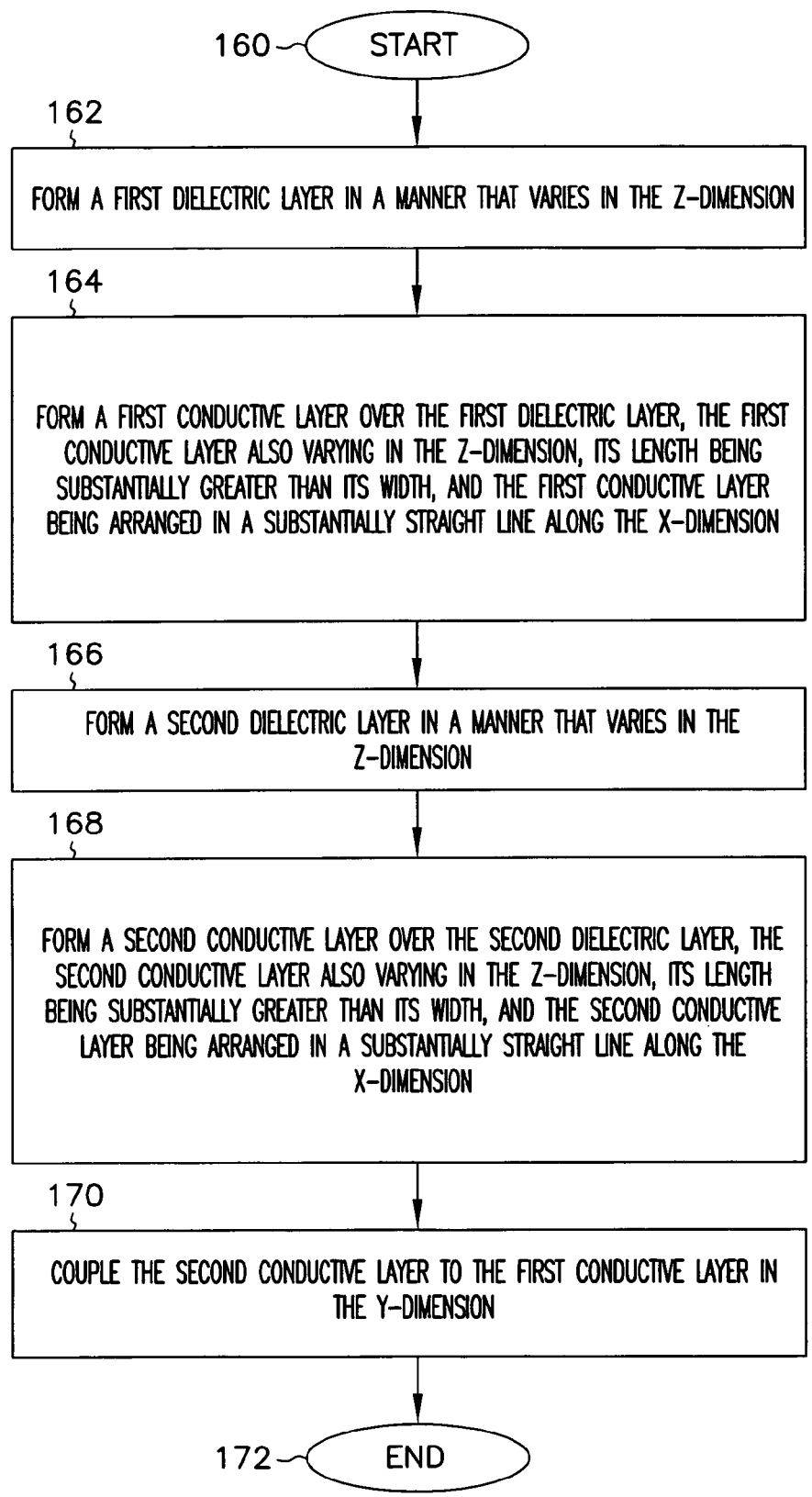
FIG. 7 illustrates a flow diagram of a method for fabricating an inductive element in accordance with one embodiment of the present invention.

FIG. 7 illustrates a flow diagram of a method 160 for fabricating an inductive element in accordance with one embodiment of the present invention. The fabrication operations described in FIG. 7 are those that relate to the fabrication of the conductive layer of the embodiment shown in FIG. 1. Other fabrication operations for the embodiment shown in FIG. 1 will depend upon the type of integrated circuit or integrated circuit package being manufactured and will be known by those of ordinary skill in the semiconductor art.

First, the process begins in box 160. In box 162 a first dielectric layer is formed in a manner that varies in the Z-dimension. (Refer to the set of X-Y-Z coordinates 50 in FIG. 1.) In this operation, the expression "layer" is used rather loosely to refer to the multi-level dielectric structure 15 (FIG. 1), which in fact will require several semiconductor process operations to fabricate.

Next in box 164 a first conductive layer is formed over the first dielectric layer. As seen in greater detail in FIG. 1, the first conductive layer (e.g. conductive layer 20 in row 2) varies in the Z-dimension, and its length is substantially greater than its width. The first conductive layer is arranged in a substantially straight line along the X-dimension. If a one-row inductive element is being fabricated, the process skips boxes 166, 168, and 170, and it ends in block 172; however, if the inductive element comprises at least two rows, the process continues in box 166. As mentioned previously regarding operation 162, in operation 164 the expression "layer" is used rather loosely to refer to the multi-level conductor structure 20 (FIG. 1), which in fact will require several semiconductor process operations to fabricate.

In box 166 a second dielectric layer is formed in a manner that varies in the Z-dimension. The first and second dielectric layers will ordinarily be fabricated simultaneously.

Next in box 168 a second conductive layer is formed over the second dielectric layer. As seen in greater detail in FIG. 1, the second conductive layer (e.g. conductive layer 20 in row 3) varies in the Z-dimension, and its length is substantially greater than its width. The second conductive layer is arranged in a substantially straight line along the X-dimension.

In box 170 the second conductive layer is coupled to the first conductive layer in the Y-dimension. The first and second conductive layers, including the portion that couples them together, will ordinarily be fabricated simultaneously.

This portion of the fabrication process ends in block 172.

The operations of the method can be carried out in any appropriate order and need not necessarily be executed in the order described with reference to FIG. 7.

As will be understood by those of ordinary skill in the art, if one or more magnetic layers, such as magnetic layer 19 or magnetic layer 21, are to be included in the inductive element, they will be formed at suitable times in the fabrication process. For example, magnetic layer 19 can be formed on insulating layer 12 before insulating layer 15 is formed. Magnetic layer 21 can be formed after conductor 20 and insulating layer 25 have been formed.

It will also be understood that for the fabrication of those embodiments of the invention, described above, in which the width of a row of the inductor structure is greater or equal to the length of the row, the process illustrated in FIG. 7 will be appropriately modified.

In summary, the inventive subject matter provides an inductive element which is integrable with an integrated circuit or an integrated circuit package, and a method of fabrication thereof, which has relatively low resistance and which is relatively inexpensive to manufacture.

In addition, the inventive subject matter provides an integrated circuit or an integrated circuit package having one or more inductive elements which have relatively low resistance and which are relatively inexpensive to manufacture.

Further, the inventive subject matter provides a method for fabricating an inductive element which has relatively low resistance and which is relatively inexpensive to manufacture. And the inventive subject matter also provides an integrated circuit and an integrated circuit package which are fabricated in accordance with the above-described method.

It is an important advantage of the inventive subject matter that relatively uncomplicated yet effective inductors can be manufactured on integrated circuits or integrated circuit packages, which inductors have relatively low resistance that is compatible with the functional requirements of advanced processes and high performance integrated circuits and integrated circuit packages. Thus, commercially competitive integrated circuits, such as microprocessors, and integrated circuit packages incorporating such inductors can be manufactured and marketed.

It is another advantage of the inventive subject matter that a large concentration of the magnetic flux from the conductive element does not tend to go down into the integrated circuit or integrated circuit package structure, where it could cause the generation of harmful mirror currents, but instead most of the magnetic flux stays relatively close to the surface of the integrated circuit or integrated circuit package, particularly when the conductor 20 is relatively wide.

In addition, the placement of the upper segments 32 of one row 180 degrees relative to those of the adjacent row provides relatively greater magnetic flux linkage between adjacent rows.

The disclosed inventive subject matter can be modified in numerous ways and can assume many embodiments other than the forms specifically set out and described above. For example, the inductor structure could be fabricated without any magnetic material, or with the magnetic material partially or entirely enclosed by the conductor, or with the conductor partially or entirely enclosed by the magnetic material, or with magnetic material only located above the conductor, or with magnetic material only located below the conductor, or with magnetic material only located to one side of the conductor.

The inventive subject matter may be practiced with any suitable type of semiconductor process known in the art.

The inventive subject matter may be embodied in other specific forms without departing from the spirit or essential characteristics thereof. The present embodiments are therefore to be considered in all respects as illustrative and not restrictive, the scope of the inventive subject matter being indicated by the appended claims rather than by the foregoing description, and all changes which come within the meaning and range of equivalency of the claims are therefore intended to be embraced therein.

The invention claimed is:

1. An integrated circuit comprising an inductive element fabricated by:

forming a first dielectric layer in a manner that varies in the Z-dimension; and forming a first conductive layer over the first dielectric layer, the first conductive layer also varying in the Z-dimension, the first conductive layer having a length and a width, the length being substantially greater than the width, the first conductive layer being arranged in a substantially straight line along the X-dimension, and the first conductive layer comprising upper segments and lower segments, the upper segments being longer than the lower segments;

wherein, in forming the first conductive layer, the first conductive layer comprises magnetic material.

2. The integrated circuit recited in claim 1 wherein, in forming the first dielectric layer, the first dielectric layer is arranged in a stepped manner.

3. The integrated circuit recited in claim 1 wherein, in forming the first dielectric layer, the first dielectric layer is arranged in an undulating manner.

4. The integrated circuit recited in claim 1 wherein, in forming the first dielectric layer, the first dielectric layer is arranged in a manner that alternates between trenches and pedestals.

5. An integrated circuit as recited in claim 1 and further fabricated by:

forming a second dielectric layer in a manner that varies in the Z-dimension;

forming a second conductive layer over the second dielectric layer, the second conductive layer also varying in the Z-dimension, the second conductive layer having a length and a width, the length being substantially greater than the width, the second conductive layer being arranged in a substantially straight line along the X-dimension, and the second conductive layer comprising upper segments and lower segments, the upper segments being longer than the lower segments; and coupling the second conductive layer to the first conductive layer.

6. The integrated circuit recited in claim 5 wherein, in forming the second conductive layer, the upper segments in the first conductive layer are offset 180 degrees from the upper segments in the second conductive layer.

7. The integrated circuit recited in claim 1 wherein, in forming the first conductive layer, the magnetic material is from the group consisting of nickel-iron, cobalt-zirconium-tantalum, iron-tantalum-nickel, nickel-iron-rhenium, and ferro-silicon.

8. The integrated circuit recited in claim 1 wherein, in forming the first conductive layer, the magnetic material is from the group consisting of iron, nickel, cobalt, manganese, zinc, zirconium, tantalum, rhenium, silicon, and the rare earth elements, or is an alloy whose constituents are from the group.

9. An integrated circuit comprising an inductive element fabricated by:

forming a first dielectric layer that varies in the Z-dimension;

forming a first conductive layer over the first dielectric layer, the first conductive layer also varying in the Z-dimension, the first conductive layer having a length and a width, the length being substantially greater than the width, the first conductive layer being arranged in a substantially straight line along the X-dimension, and the first conductive layer comprising upper segments and lower segments, the upper segments being longer than the lower segments;

forming a second dielectric layer that varies in the Z-dimension;

forming a second conductive layer over the second dielectric layer, the second conductive layer also varying in the Z-dimension, the second conductive layer having a length and a width, the length being substantially greater than the width, the second conductive layer being arranged in a substantially straight line along the X-dimension, and the second conductive layer comprising upper segments and lower segments, the upper segments being longer than the lower segments; and coupling the second conductive layer to the first conductive layer;

wherein the first and second dielectric layers are formed simultaneously; and wherein the first and second conductive layers are formed simultaneously.

10. The integrated circuit recited in claim 9 wherein, in forming the first dielectric layer, the first dielectric layer is arranged in a stepped manner.

11. The integrated circuit recited in claim 9 wherein, in forming the first dielectric layer, the first dielectric layer is arranged in an undulating manner.

12. The integrated circuit recited in claim 9 wherein, in forming the first dielectric layer, the first dielectric layer is arranged in a manner that alternates between trenches and pedestals.

13. The integrated circuit recited in claim 9 wherein, in forming the second conductive layer, the upper segments in the first conductive layer are offset 180 degrees from the upper segments in the second conductive layer.

14. The integrated circuit recited in claim 9 wherein, in forming the first conductive layer, the first conductive layer comprises material from the group consisting of copper, aluminum, tungsten, molybdenum, titanium, gold, silver, palladium, a metal silicide, doped polysilicon, or is an alloy whose constituents are from the group.

15. The integrated circuit recited in claim 9 wherein, in forming the first conductive layer, the first conductive layer comprises magnetic material.

16. The integrated circuit recited in claim 15 wherein, in forming the first conductive layer, the magnetic material is from the group consisting of nickel-iron, cobalt-zirconium-tantalum, iron-tantalum-nickel, nickel-iron-rhenium, and ferro-silicon.

17. The integrated circuit recited in claim 15 wherein, in forming the first conductive layer, the magnetic material is from the group consisting of iron, nickel, cobalt, manganese, zinc, zirconium, tantalum, rhenium, silicon, and the rare earth elements, or is an alloy whose constituents are from the group.

18. An integrated circuit comprising an inductor fabricated by:

forming a first dielectric layer that varies in the Z-dimension;

forming a first conductive layer over the first dielectric layer, the first conductive layer also varying in the Z-dimension, the first conductive layer having a length and a width, the length being substantially greater than the width, the first conductive layer being arranged in a substantially straight line along the X-dimension, and the first conductive layer comprising upper segments and lower segments, the upper segments being longer than the lower segments, forming a magnetic layer comprising magnetic material over the first conductive layer, the magnetic layer also varying in the Z-dimension.

19. The integrated circuit recited in claim 18 wherein, in forming the magnetic layer, the magnetic material is from the group consisting of nickel-iron, cobalt-zirconium-tantalum, iron-tantalum-nickel, nickel-iron-rhenium, and ferro-silicon.

20. The integrated circuit recited in claim 18 wherein, in forming the magnetic layer, the magnetic material is from the group consisting of iron, nickel, cobalt, manganese, zinc, zirconium, tantalum, rhenium, silicon, and the rare earth elements, or is an alloy whose constituents are from the group.

* * * * *

UNITED STATES PATENT AND TRADEMARK OFFICE
CERTIFICATE OF CORRECTION

| | | |
|---|---|---|
| PATENT NO. | : 7,087,976 B2 | Page 1 of 1 |
| APPLICATION NO. | : 10/774956 | |
| DATED | : August 8, 2006 | |
| INVENTOR(S) | : Gardner | |

It is certified that error appears in the above-identified patent and that said Letters Patent is hereby corrected as shown below:

TITLE page, ITEM (56), under "Other Publications", in column 2, line 3, delete "XP00150520," and insert -- XP000150520, --, therefor.

Signed and Sealed this

Fourteenth Day of November, 2006

JON W. DUDAS
*Director of the United States Patent and Trademark Office*